(12) United States Patent
Kuge et al.

(10) Patent No.: US 6,424,593 B1
(45) Date of Patent: Jul. 23, 2002

(54) SEMICONDUCTOR MEMORY DEVICE CAPABLE OF ADJUSTING INTERNAL PARAMETER

(75) Inventors: Shigehiro Kuge; Tetsuo Kato, both of Hyogo (JP)

(73) Assignee: Mitsubishi Denki Kaubushiki Kaisha, Tokyo (JP)

(*) Notice: Subject to any disclaimer, the term of this patent is extended or adjusted under 35 U.S.C. 154(b) by 52 days.

(21) Appl. No.: 09/811,580

(22) Filed: Mar. 20, 2001

(30) Foreign Application Priority Data

Jul. 27, 2000 (JP) ........................ 2000-227050

(51) Int. Cl.[7] .................................. G11C 8/00
(52) U.S. Cl. ...................... 365/233; 365/194
(58) Field of Search ................. 365/233, 194, 365/222, 225.7

(56) References Cited

U.S. PATENT DOCUMENTS 5,631,862 A    5/1997  Cutter et al. ............. 365/225.7
5,953,285 A  * 9/1999  Churchill et al. .......... 365/233
6,160,755 A  * 12/2000 Norman et al. ............ 365/233

* cited by examiner

Primary Examiner—Trong Phan
(74) Attorney, Agent, or Firm—McDermott, Will & Emery

(57) ABSTRACT

Internal parameter control signal generating units generate internal parameter control signals for adjusting internal parameters of a semiconductor memory device. Each internal parameter control signal generating unit includes an anti-fuse element formed with a data holding capacitor of a memory cell. The anti-fuse element is blown with application of a high voltage according to a parameter adjustment signal to break down a dielectric film and then, act as a resistance element. The internal parameter control signal generating unit sets a signal level of a corresponding internal parameter control signal in a non-volatile manner according to the presence or absence of a blowing input to the anti-fuse element.

15 Claims, 11 Drawing Sheets

FUSE-BLOWING INPUT

ANTI-FUSE-BLOWING INPUT

SEMICONDUCTOR MEMORY DEVICE CAPABLE OF ADJUSTING INTERNAL PARAMETER

BACKGROUND OF THE INVENTION

1. Field of the Invention

The present invention relates a semiconductor memory device and more particularly, to a semiconductor memory device capable of adjusting an internal parameter after package molding.

2. Description of the Background Art

In recent years, requirements for not only a large capacity but also high speed of a semiconductor memory device have been piled up; an interfacing technique in a high frequency region largely exceeding 100 MHz has also been necessary in DRAM (Dynamic Random Access Memory). Under such circumstances, a possibility has been enhanced that variations in internal parameters of a chip caused by fluctuations in conditions for the fabrication process thereof exert adverse influences on an operation of a semiconductor memory device.

Especially, in a memory device with high speed, it has been important to reduce a variation in capacity added to a node (hereinafter referred to input capacitance as well) to which an external signal is input. Such a variation in input capacitance $\Delta Cin$ leads to a change in delay between external signals caused when the signals are caught into the device. As a result, timings in generation of internal signals in the device in response to the external signals are different therebetween, and on this occasion, a possibility occurs that normal operation of the memory device cannot be performed in the entirety.

For example, in a memory device of a 100 MHz class, a precision of a level $\Delta Cin=1.0$ pF ($1.0\times10^{-12}$F) has been generally required with respect of a variation in input capacitance. With this level adjusted, an input capacitance has been sufficiently adjustable by fine tuning of a pattern of an aluminum wring layer following fabrication of a semiconductor chip. In memory device of a 800 MHz class, however, since timing specifications or setting-up and holding are strictly defined at a level of a system in which a DRAM is incorporated, a strict precision to a level $\Delta Cin=50$ fF ($5.0\times10^{-14}$F) is imposed on the input capacitance as requirement.

Adjustment of an input capacitance to such a strict precision is very hard to be achieved only by fine control of process conditions for the fabrication represented by pattern adjustment in a wring layer. This is because a variation in capacitance value caused by deformation such as of cable interconnects in resin encapsulation of a molding step cannot be neglected to satisfy a required precision; therefore, an input capacitance as designed is very hard to be achieved to such a level of precision.

Moreover, in a mas production stage, an input capacitance of each chip and an input capacitance at each pin of the chip are further varied by fluctuations in conditions for a fabrication process; therefore, control of variations in input capacitances has been very hard only by a design prior to the molding and control of the conditions for a fabrication process.

Furthermore, in a memory device requiring a high speed operation, a skew indicating a phase shift of an input/output signal from a reference clock has also been becoming an important specification.

FIG. 19 is a conceptual diagram representing a configuration performing data output in synchronism with a trigger clock.

In FIG. 19, for example, shown is a configuration in which data of 16 bits are output through 16 data terminals 200-0 to 200-15. Data output buffers 210-0 to 210-15 are provided correspondingly to the respective data terminals 200-0 to 200-15. The data output buffers output data to respective corresponding data terminals at a timing according to a trigger clock signal CLK transmitted from a clock buffer 220.

Since the clock buffer 220 is shared by a plurality of data output buffers, there arises a shift in data output timing between a data output buffer in the central section close to the clock buffer 220 (for example, 210-7 or 210-8) and a data output buffer far from the clock buffer 220 (for example, 210-0 or 210-15) due to a difference in delay in propagation of a trigger clock therebetween and thereby, a problem occurs since a phase shift referred to as skew is generated. In a DRAM operating at high speed, since a data output cycle becomes shorter, none of such a skew will be able to be neglected.

Moreover, while in DRAM, holding data is required to be executed by a refresh operation, a cycle in which a refresh operation is performed (hereinafter simply referred to as refresh cycle) is largely related to power consumption of the entire DRAM. While a refresh cycle is set to a time length shorter than a cycle in which data holding can be ensured in DRAM, the refresh cycle is, on the other hand, set as long as possible and thereby, reduction in power consumption can be realized. Hence, in a high frequency DRAM having a tendency of increasing power consumption, it is an important technique to set a proper refresh cycle.

A data holding characteristic of DRAM, however, alters between before and after package molding step; therefore, a prior art method in which a refresh cycle is set by fuse blowing based on a test result in wafer test conducted in a chip state has had difficult performing fine setting of a refresh cycle.

Furthermore, in a memory, a word structure showing the number of bits of data which can be simultaneously input/output in one time addressing has been generally determined before the package molding according to whether a wring pattern or bonding is present or absent.

FIGS. 20A and 20B are conceptual diagrams describing a prior art setting method for a word structure.

Referring to FIGS. 20A and 20B, a word structure is set according to whether coupling between a lead frame 230 coupled with a power source potential (ext.VCC) terminal 240 and a mode select terminal 250 are present or absent. In FIGS. 20A and 20B, shown are respective cases of no coupling and coupling between the mode select terminal 250 and the lead frame 230.

FIG. 21 is a circuit diagram representing a configuration of a mode select circuit generating a mode select signal according to a coupling state of a mode select terminal.

Referring to FIG. 21, a mode select circuit 260 includes P type MOS transistors 252 and 254 coupled in parallel between a power source potential ext.VCC and a node N0, an N type MOS transistor 256 coupled between the node N0 and a ground potential Vss, and an inverter 258 generating a mode select signal MSL according to a potential level of the node N0. A power-on reset signal/POR which is activated to L level for a prescribed period after power-on is input to the gate of the transistor 252. A mode select terminal 250 is coupled to the gate of the transistor 256.

Accordingly, as shown in FIG. 20A, when the mode select terminal 250 is not coupled to the lead frame 230 and in a floating state, the transistor 256 is not turned on, therefore, a potential level of the node NO goes to H level at a timing at which a power-on reset signal/POR is activated (to L level) and a mode select signal MSL is set to L level. Since the mode select signal MSL is input to the gate of the transistor 254, L level of the mode select signal MSL is latched by the inverter 258 and the transistor 254.

On the other hand, as shown in FIG. 20B, when a mode select terminal 250 is coupled with a lead frame 230, a transistor 256 is turned on; therefore, a mode select signal MSL is set to H level if a power-on reset signal/POR is finally deactivated (to H level) even after the power-on reset signal/POR is activated (to L level) for a prescribed period following power-on.

In such a way, a mode select signal is set to H level or L level according to the presence or absence, respectively, of coupling between the mode select terminal 250 and the lead frame 230. Hence, for example, when a signal level of a 2 bit mode select signal is defined using two mode select terminals, one of word structures of $2^2=4$ kinds, for example, one of x4 bits/x8 bits/x16 bits/x32 bits can be used, while switching over the word structures.

Selection of such a coupling state between the mode select terminal 250 and the lead frame 230 has been generally determined prior to the package molding according to selection of whether or not wring is formed by master switching-over, or whether or not bonding is performed.

When a word structure is fixed prior to the package molding, however, in a product with a small number of bits in a word structure, an operation test time which is performed after the packaging cannot be reduced taking advantage of a so-called multi-bit test effect even in a case where a data bus width in the product device is large.

As described above, a requirement has occurred, especially in a high-speed operating memory device, that internal parameters such as an input capacitance, a skew, a refresh cycle, a word structure setting and others are adjusted from outside the mold package after execution of an operation test. In the prior art, such adjustment of internal parameters after package molding was performed by blowing an electric fuse which had been provided inside with a high potential signal applied externally.

By means of this method, however, since there is a requirement to additionally provide electric fuses, a burden occurs in aspects of layout area and cost.

SUMMARY OF THE INVENTION

It is an object of the present invention to provide a configuration of a semiconductor memory device capable of adjustment or alteration of an internal parameter after package molding without adding a special element such as an electric fuse to the device.

The present invention will be summarized that is directed to a semiconductor memory device including: a plurality of memory cells; a plurality of parameter adjustment terminals; an internal parameter control circuit; and an internal circuit.

Each of the plurality of memory cells has a capacitor for holding data. The plurality of parameter adjustment terminals can be input with signals from outside after package molding. The internal parameter control circuit is provided for adjustment of internal parameters of the semiconductor memory device from outside. The internal circuit operates based on internal parameters set according to signal levels of respective plural internal parameter control signals. The internal parameter control circuit includes a plurality of control signal generating units provided correspondingly to the respective plurality of parameter adjustment terminals and generating respective plural internal parameter control signals. Each of the plurality of control signal generating units includes a program element responding to a signal input to a corresponding one of the plurality of parameter adjustment terminals to make a non-volatile transition from a first state to a second state. The program element has a capacitor forming one of the plurality of memory cells. Each control signal generating unit not only sets a signal level of a corresponding one of the plurality of internal parameter control signals according to a state of the program element in response to turning-on of a power source for the semiconductor memory device, but also holds the signal level during turning-on of the power source. The internal circuit operates based on the internal parameters set according to the signal levels of the plurality of internal parameter control signals.

A major advantage of the present invention is accordingly in a capability that an internal parameter is adjusted in a non-volatile manner from outside a mold package by a program using a memory cell. As a result, product yield of a semiconductor memory device can be improved by a fine adjustment on the internal parameter without providing a special program element additionally.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Below, detailed description will be given of embodiments of the present invention using the accompanying drawings. Note that the same symbols in the figures indicate the same or corresponding constituents.

First Embodiment

Figure 1:
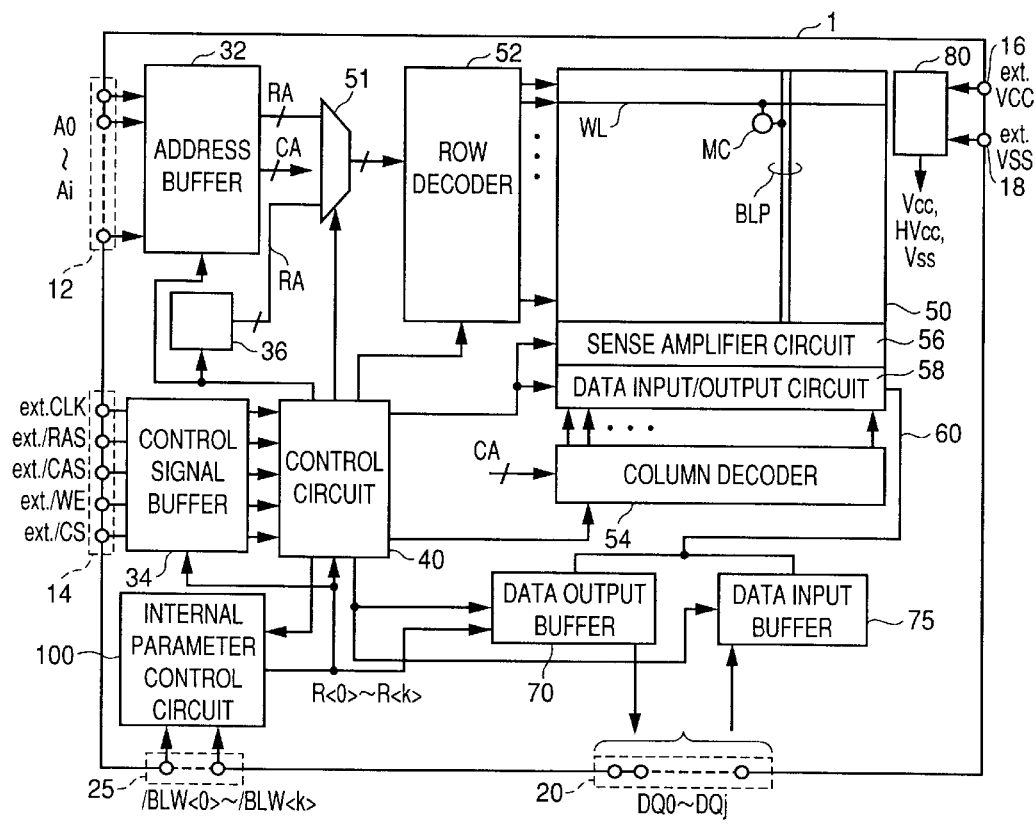
FIG. 1 is a schematic block diagram showing a configuration of a semiconductor memory device 1 according to an embodiment of the present invention.

Referring to FIG. 1, a semiconductor memory device 1 includes an address input terminal 12 receiving address signals A0 to Ai (i is a natural number), a control signal input terminal 14 receiving an external clock ext.CLK, a row address strobe signal ext./RAS, a column address strobe signal ext./CAS, a write enable signal ext.WE, and a chip select signal ext./CS and others, which are supplied from outside, power source terminals 16 and 18 receiving a power source potential ext.VCC and a ground potential ext.VSS, respectively, and a data input/output terminal 20 performing inputting/outputting of data DQ0 to DQj of (j+1) bits (j is a natural number).

The semiconductor memory device 1 further includes an address buffer 32 receiving address signals A0 to Ai from the address input terminal 12 to convert the address signals into internal address signals indicating a row address RA and a column address CA, a control signal buffer 34 receiving a group of control signals from the control signal input terminal 14 to generate corresponding internal control signals, a refresh address generating circuit 36 generating a row address in a refresh operation, and a control circuit 40 receiving a group of the internal control signals from the control signal buffer 34 to control internal operations of all of the semiconductor memory device 1.

The semiconductor memory device 1 further includes a memory cell array 50 having a plurality of memory cells arranged in rows and columns. In the memory cell array 50, word lines WL are disposed corresponding to respective memory cell rows and bit line pairs BLP are disposed corresponding to respective memory cell columns. In FIG. 1, shown is placement of a word line WL and a bit line pair BLP corresponding to one memory cell MC illustrated typically.

Figure 2:
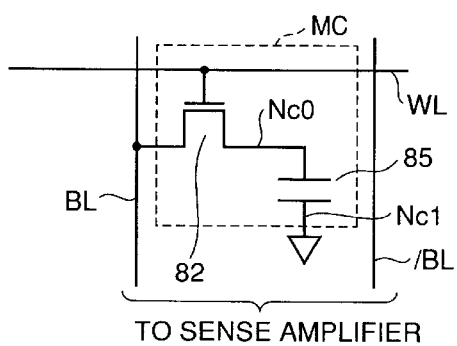
FIG. 2 is a circuit diagram representing a configuration of a memory cell MC.

In FIG. 2, shown is a typical memory cell configuration of a DRAM.

Referring to FIG. 2, a memory cell MC includes an access transistor 82 coupled electrically between a storage node Nc0 and a bit line BL, and a capacitor 85 for holding an electric charge transmitted to the storage node Nc0. The capacitor 85 is coupled between the storage node Nc0 and a node Nc1. In data holding, a potential level of the node Nc1 is set to the ground potential Vss corresponding to an L level potential of data.

The gate of the access transistor 82 is coupled to a word line WL. The access transistor 82 is turned on in response to activation (to H level) of the word line WL and thereby, the bit line BL and the storage node Nc0 are connected to perform reading and writing of data on the storage node Nc0. A bit line /BL transmits data complementary to the bit line BL and both lines constitute a bit line pair BLP. A potential difference between the bit lines BL and /BL is amplified by a sense amplifier.

Referring again to FIG. 1, the semiconductor memory device 1 further includes a selector circuit 51 receiving row addresses RA generated by the address buffer 32 and the refresh address generating circuit 36, respectively, to selectively output one of the row addresses RA, a row decoder 52 performing selection of a memory cell row according to the row address RA output by the selector circuit 51, a column decoder 54 performing selection of a memory cell column according to a column address CA output by the address buffer 32, a sense amplifier circuit 56, a data input/output circuit 58, and a data I/O line 60.

The row decoder 52 selectively activates at least one of the word lines WL in the memory cell array 50 in response to the row address output by the selector 51 in row selection. The sense amplifier circuit 56 amplifies a potential difference occurring between complementary lines of each bit line pair BLP. The data input/output circuit 58 selectively couples the sense amplifier circuit 56 and the data I/O line 60 in response to the selection result of the column by the column decoder 54 to perform supplying/receiving of data for the memory cell array 50.

The semiconductor memory device 1 further includes a data output buffer 70 and a data input buffer 75 for performing data transmitting/receiving between the data I/O line 60 and the data input/output terminal 20. The data output buffer 70 and the data input buffer 75 perform data inputting/outputting at a timing in synchronism with a clock signal CLK generated by the control circuit 40. In connection with the timings of data inputting/outputting for the data input/output terminal 20, it is important to suppress a skew in a relation to other devices disposed in the same system.

The semiconductor memory device 1 further includes a power supply circuit 80 generating a power source potential Vcc, a ground potential Vss and a high potential HVcc all used in the semiconductor memory device 1 corresponding to the external power supply potential ext.VCC and the external ground potential ext.VSS input to the power source terminals 16 and 18. The power source potential Vcc and the ground potential Vss are supplied to circuits in the semiconductor memory device 1. The high potential HVcc is supplied to an internal parameter control circuit 100.

The semiconductor memory device 1 further includes a parameter adjustment terminal 25 through which parameter adjustment signals/BLW <0> to /BLW <k> (k is a natural number) can be input from outside the mold package, and the internal parameter control circuit 100 activating internal parameter control signals R<0> to R<k> in a non-volatile manner in response to the parameter adjustment signals/BLW<0> to /BLW<k>. Internal parameters of the semiconductor memory device 1 are adjusted in response to the internal parameter signals R<0> to R<k>. Note that it is also hereinafter referred simply to "program" to store an external instruction input inside in a non-volatile manner.

Note again that inputting of the parameter adjustment signals /BLW <0> to /BLW<k> can be performed through an existing input terminal in a common use manner without providing a dedicated input terminal 25.

Figure 3:
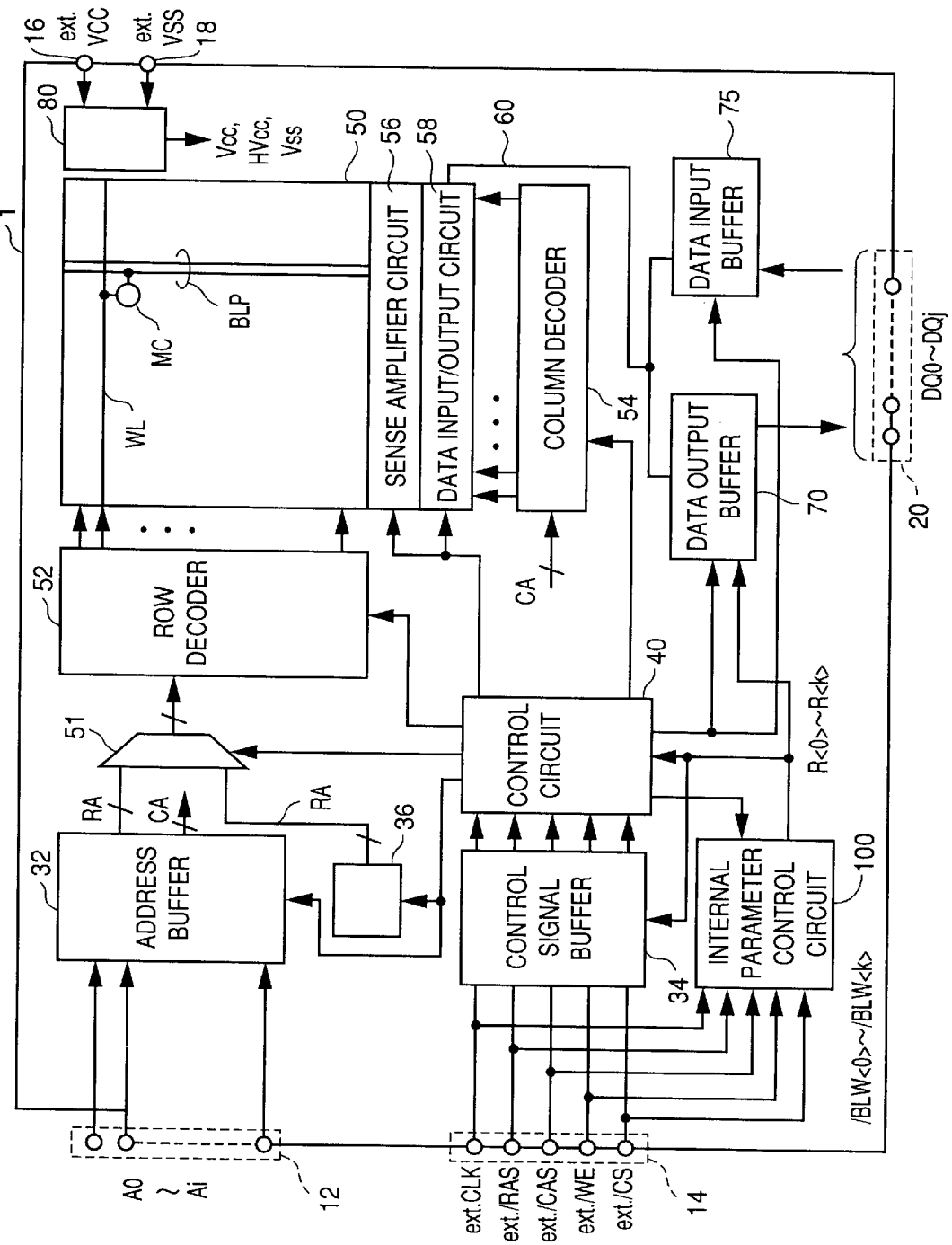
FIG. 3 is a schematic block diagram showing another example of configuration, of the semiconductor memory device 1.

Referring to FIG. 3, the parameter adjustment signals /BLW<0> to /BLW<k> are input, for example, using the control signal input terminal 14.

In a normal mode, control signals are input to the control signal input terminal 14. When the parameter adjustment signals /BLW<0> to /BLW<k> are input, a specific combination of control signals for switching-over operating mode by the control circuit 40 is input to the control signal input terminal 14.

The control circuit 40 switches, for example, over operating modes to a parameter adjustment mode from the normal mode in response to the specific combination of control signals. In the parameter adjustment mode, the internal parameter control circuit 100 catches an input to the control signal input terminal 14 as parameter adjustment signals /BLW<0> to /BLK<k>.

When in the internal parameter control circuit 100, a program of adjustment instruction from outside according to the parameter adjustment signals /BLW<0> to /BLK<k> is completed, a combination of control signals for switching-over the operating mode is input to the control signal input terminal 14. In response to this, the control circuit 40 restores an operating mode to the normal mode from the parameter adjustment mode.

By adopting such a configuration, the parameter adjustment signals /BLW<0> to /BLK<k> can be input without a dedicated input terminal. Note that while in FIG. 3, shown is a configuration in which the control signal input terminal 14 is shared for inputting the parameter adjustment signals /BLW<0> to /BLK<k> and for inputting the control signals, the parameter adjustment signals /BLW<0> to /BLK<k> can be input to the address input terminal 12 or the like with a similar method.

The internal parameter control circuit 100 includes internal parameter control signal generating units 110-0 to 110-k for generating the internal parameter control signals R<0> to R<k> corresponding to the respective parameter adjustment signals /BLW<0> to /BLK<k>.

Description will be given of a configuration of an internal parameter control signal generating unit using FIG. 4. Since configurations of internal parameter control signal generating units are similar to each other, in FIG. 4, shown is a configuration of the internal parameter control signal generating unit 100-0 corresponding to the parameter adjustment signal /BLW<0> and the internal parameter control signal R<0>.

Figure 4:
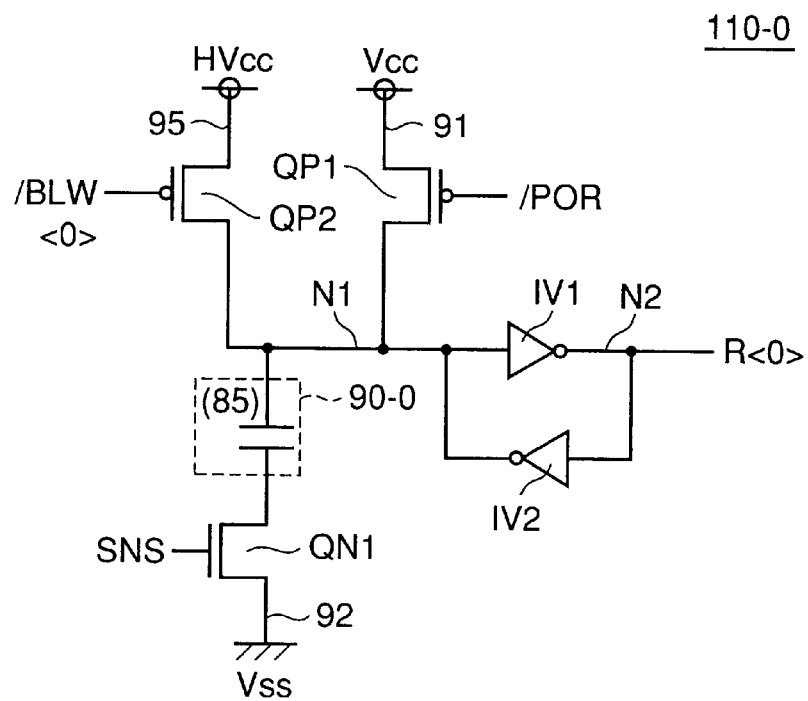
FIG. 4 is a circuit diagram representing a configuration of an internal parameter control signal generating unit.

Referring to FIG. 4, the internal parameter control signal generating unit 110-0 includes a P type MOS transistor QP1 coupled between a power source supply node 91 supplying the power source potential Vcc (hereinafter simply referred to as power source potential node 91 as well) and a node N1, a P type MOS transistor QP2 coupled between a power source supply node 95 supplying the high potential HVcc (hereinafter simply referred to as high power source potential node 95 as well) and the node N1, and an anti-fuse element 90-0 and an N type MOS transistor QN1 coupled in series between a power source supply node 92 supplying the ground potential Vss (hereinafter simply referred to as ground node 92 as well) and the node N1.

A power-on reset signal /POR which is activated to L level for a prescribed period after turning-on of a power source for a semiconductor memory device 1 is input to the gate of the transistor QP1. The parameter adjustment signal /BLW<0> is input to the gate of the transistor QP2. A sense signal SNS serving as a trigger signal which reflects a state of the anti-fuse element 90 on the internal parameter control signal R<0> is input to the gate of the transistor QN1.

The internal parameter control signal generating unit 110 further includes an inverter IV1 inverting a signal level of the node N1 to output the inverted signal to the node N2 as an internal parameter control signal R<0>, and an inverter IV2 inverting a signal level of the node N2 to output the inverted signal to the node N1. The inverters IV1 and IV2 act as latch circuits for holding a signal level of the internal parameter control signal R<0>.

In the present invention, the anti-fuse element 90-0 is formed of the same element as a memory cell MC constituting the memory cell array 50. The anti-fuse element 90-0 can be constituted using a capacitor 85 in the memory cell MC shown in FIG. 2. Compared with FIG. 2, it is only required that the word line WL and the bit line BL are connected to the node N1 of FIG. 4 and the node Nc1 of FIG. 2 is coupled to the drain of the transistor QN1.

Note that the present invention is not applied limitedly to a memory cell of the configuration shown in FIG. 2, but can be applied to semiconductor memory devices with memory cells each of a configuration including a capacitor for holding data.

In a semiconductor memory device, since memory cells MC are fabricated on a chip in state of a gate array, a redundant memory cell not used in data storage can be used as the anti-fuse element 90-0. In such a way, by programming a parameter adjustment instruction supplied externally using redundant memory cells without using special fuse-elements, reduction in layout area and cost can be achieved.

The anti-fuse element 90-0 acts as a capacitor in a state before blowing and cuts off connection between the node N1 and the transistor QN1. Hence, in this state, since a potential level of the node N1 is at the power source potential Vcc level (H level) even if the power-on reset signal /POR and the sense signal SNS are activated, a signal level of the internal parameter control signal R<0> is set to L level.

Figure 5:
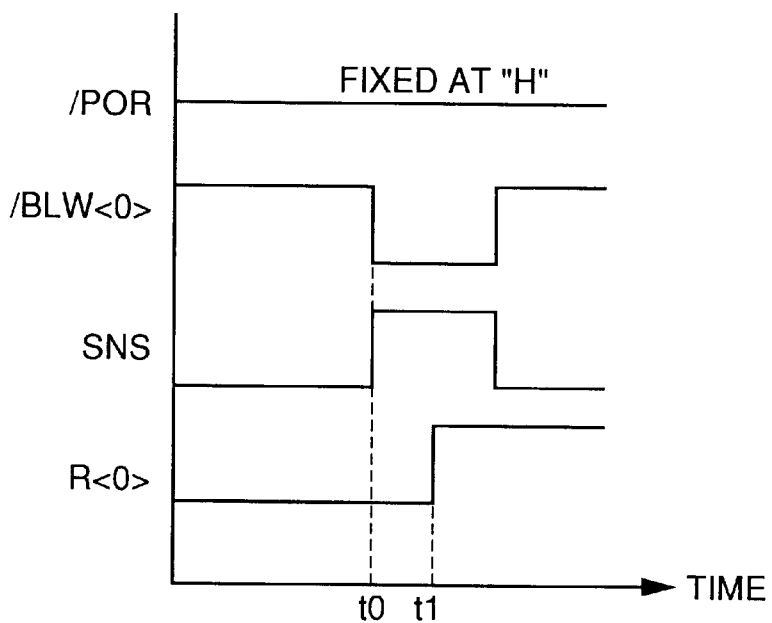
FIG. 5 is a timing chart describing an operation to blow an anti-fuse element.

Referring to FIG. 5, the power-on reset signal /POR is fixed at H level when the anti-fuse element 90-0 is blown. In this state, the parameter adjustment signal /BLW<0> activated to L level is input at a time to and the sense signal SNS is further activated and thereby, the anti-fuse element 90-0 is applied with the high potential HVcc. By doing so, a dielectric film of a capacitor forming the anti-fuse element 90-0 is broken down, the anti-fuse element 90-0 is blown.

Figure 6:
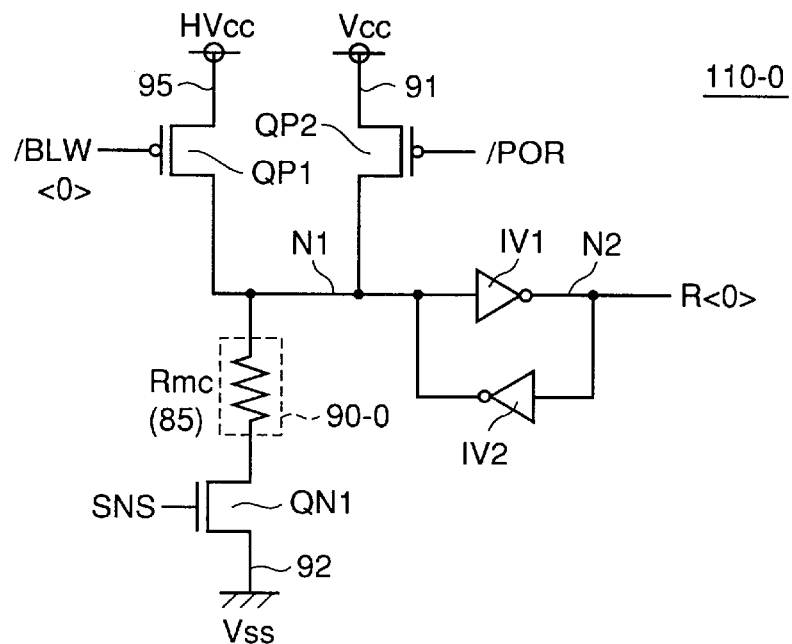
FIG. 6 is a circuit diagram representing a state of the internal parameter control signal generating unit after the blowing.

Referring to FIG. 6, after application of the high potential HVcc, that is, after the blowing, the dielectric film of the capacitor 85 in a memory cell used as the anti-fuse element 90-0 is broken down and therefore, the anti-fuse element 90-0 acts as a resistance element. Herein, by designing such that a resistance value Rmc of the capacitor after the breakdown of the dielectric film is lower than a prescribed value, a signal level of the internal parameter control signal R<0> can be altered from a state before the blowing, after a time t1 as shown in FIG. 4.

Figure 7:
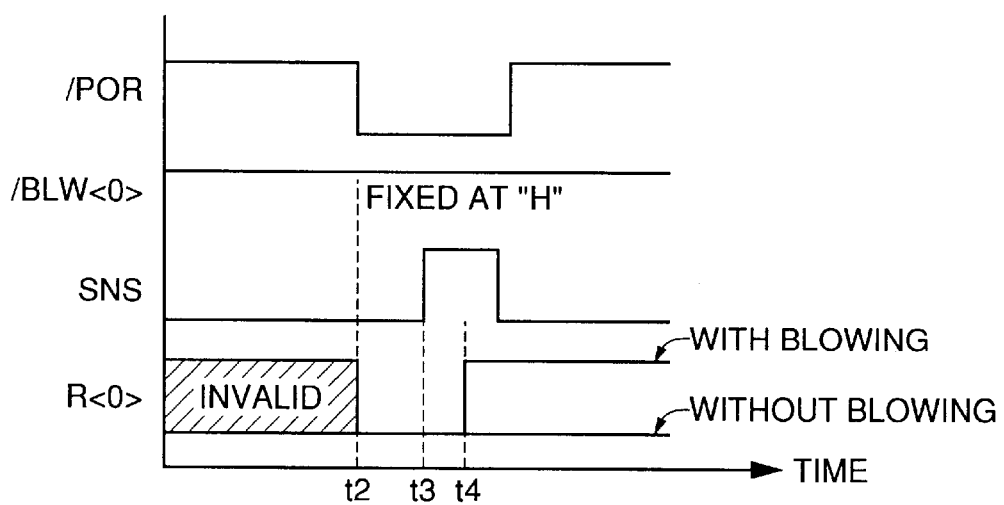
FIG. 7 is a timing chart describing an operation of the internal parameter control signal generating unit on turning-on of a power supply.

Referring to FIG. 7, the internal parameter control signal R<0> is an invalid state in a situation where the power-on reset signal /POR and the parameter adjustment signal /BLW<0> are both inactivated (to H level) and the sense signal SNS is also inactivated (to L level).

In this situation, at a time t2, the power-on reset signal /POR is activated to L level in response to power-on. Furthermore, when the sense signal SNS is activated to H level at a time t3 and the anti-fuse element is blown, a current path is produced from the power source potential node 91 through the transistor QP2, through the node N1, through the anti-fuse element 90 (Rmc), and through the transistor QN1 to the ground node 92. At this time, when a resistance value Rmc of the anti-fuse element is a prescribed value or lower and a potential level of the node N1 is reduced to a threshold voltage or lower of the inverter IV1, a signal level of the internal parameter control signal R<0> is set to H level at a time t4.

On the other hand, when the anti-fuse element 90 is not blown, a signal level of the internal parameter control signal R<0> is set to L level since the node N1 is coupled to the power source potential node 91 as described in FIG. 4. A signal level of the internal parameter control signal R<0> set according to whether or not the blowing is performed when a power source is turned on is latched by the inverters IV1 and IV2 during turning-on of the power source.

The internal parameter control signal generating units 110-1 to 110-k generating the other internal parameter control signals R<1> to R <k> are each of a similar configuration and in each internal parameter control signal generating unit, the series of operations are performed each time a power source is turned on. In such a way, an adjustment instruction of the parameter adjustment signal /BLW<0> supplied from outside can be programmed inside using a similar element as a memory cell MC.

Description will be given of a configuration to adjust a variation in input capacitance using internal parameter control signals in the first embodiment.

Figure 8:
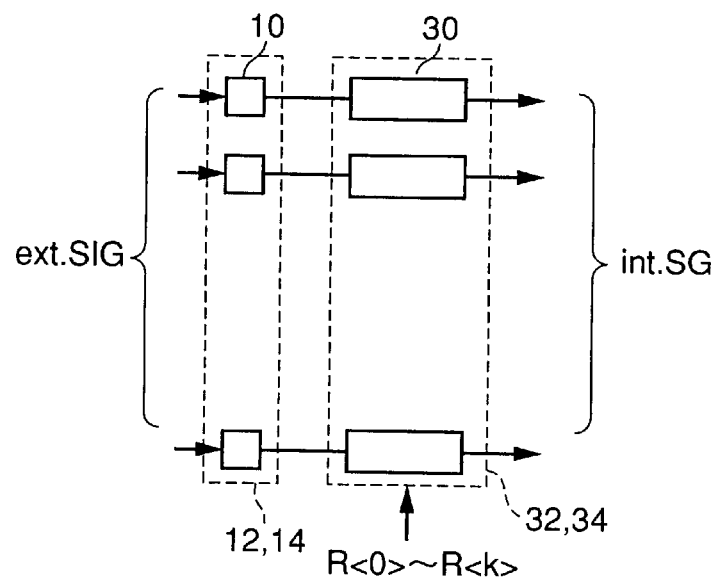
FIG. 8 is a schematic block diagram showing generation of an internal signal in the semiconductor memory device 1.

FIG. 8 is a schematic block diagram showing generation of an internal signal in the semiconductor memory device.

Referring to FIG. 8, address signals and control signals are externally input to the address input terminal 12 and the control signal input terminal 14. In FIG. 8, not only are the input signals from outside collectively referred to as an external signal ext.SIG but also the input terminals are also collectively indicated by a numerical symbol 10.

The address buffer 32 and the control signal buffer 34 generate internal address signals and internal control signals, respectively, in response to respective signals of the external signal ext.SIG. In FIG. 8, the internal address signals and the internal control signals are collectively referred to an internal signal int.SG. The address buffer 32 and the control signal buffer 34 includes input buffer units 30 provided correspondingly to respective signals of the internal signal int.SG. Each input buffer unit 30 generates an internal signal according to a signal level of a corresponding external signal.

Figure 9:
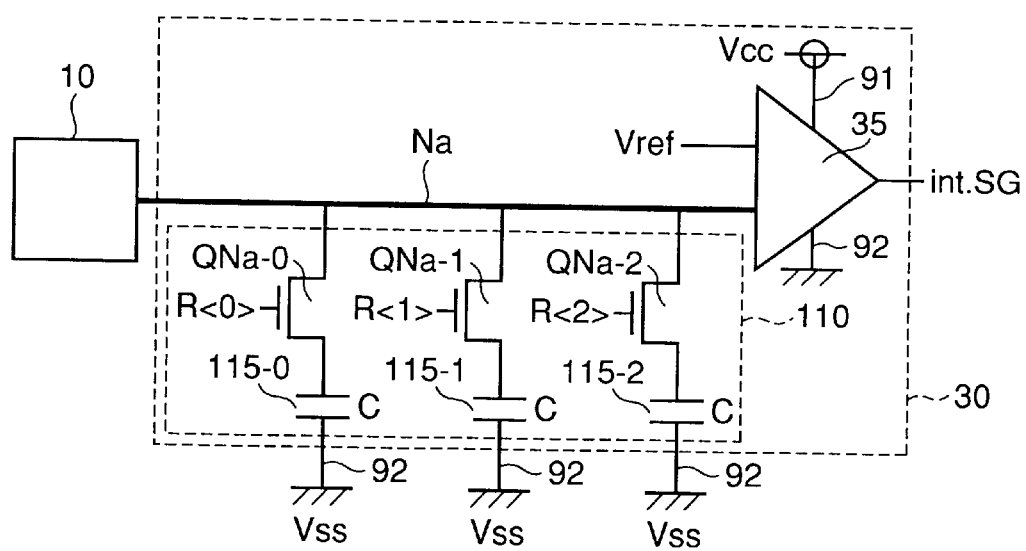
FIG. 9 is a circuit diagram representing a configuration of an input buffer unit 30 according to a first embodiment of the present invention.

Referring to FIG. 9, the input buffer unit 30 includes an input capacitance adjustment circuit 110 for adding an input capacitance for adjustment to a node Na coupled to the input terminal 10, and an differential amplifier circuit 35 generating an internal signal int.SG by comparison in potential level between the node Na and the reference signal Vref.

The input capacitance adjustment circuit 110 includes a pair of an N type MOS transistor QNa-0 and a capacitor 115-0, a pair of an N type MOS transistor QNa-1 and a capacitor 115-1, and a pair of an N type MOS transistor QNa-2 and a capacitor 115-2. Each N type MOS transistor and each capacitor are connected in series between the node Na and a ground node 92. The pairs of an N type MOS transistor and a capacitor are arranged in parallel to one another.

While in FIG. 9, shown is a configuration in which an input capacitance is adjusted by an internal parameter control signal set of three bits R<0> to R<2> as an example, the number of bits of the internal parameter control signal set can be set arbitrarily.

When capacitance values of the capacitors 115-0 to 115-2 are all C by definition, an input capacitance added to the node Na can be adjusted to any of 4 levels of 0, C, 2C and 3C according to signal levels of the internal parameter control signals R<0> to R<2> in each input capacitance adjustment circuit 110.

In such a way, when an added input capacitance is set according to an independent internal parameter control signal in the input capacitance adjustment circuit 110 of each input buffer unit 30, an input capacitance at each input terminal can be adjusted in a non-volatile manner based on an actual measurement result and others in an operation test according to the parameter adjustment signals /BLW<0> to /BLW<k> which can be input from outside the package mold.

When an added input capacitance in each input buffer unit 30 is set corresponding to an independent internal parameter control signal, a variation in input capacitance generated in the fabrication can be adjusted to put relative timings in generating internal signals in order. In a particular case, when an input capacitance is controlled to be smaller than a design value in the fabrication stage and the input capacitance is gradually increased based on a result in actual measurement, a variation in input capacitance can be further reduced.

Note that when capacitance values of the capacitors 115-0 to 115-2 are C ($2^0$C), 2C ($2^1$C) and 4C ($2^2$C), respectively, an added input capacitance can be adjusted to any of 8 levels of 0, C, 2C, ..., 7C according to the internal parameter control signal set of three bits R<0> to R<2>.

In such a way, when capacitance values of the capacitors of each input buffer unit 30 are set to $2^I$·C(I is a natural number of 0 to (J−1)) according to the number of bits J (J is a natural number) of an internal parameter control signal used in the input buffer unit 30, finer adjustment in input capacitance can be performed.

Note that while in FIGS. 8 and 9, shown is a configuration in which each input buffer unit 30 includes an input capacitance adjustment circuit 110, input capacitance adjustment circuits 110 can be equipped only in some of input buffer units 30 provided according to reasons in designing.

Second Embodiment

In the second embodiment, description will be given of a configuration in which a skew of output data is adjusted using an internal parameter control signal.

Figure 10:
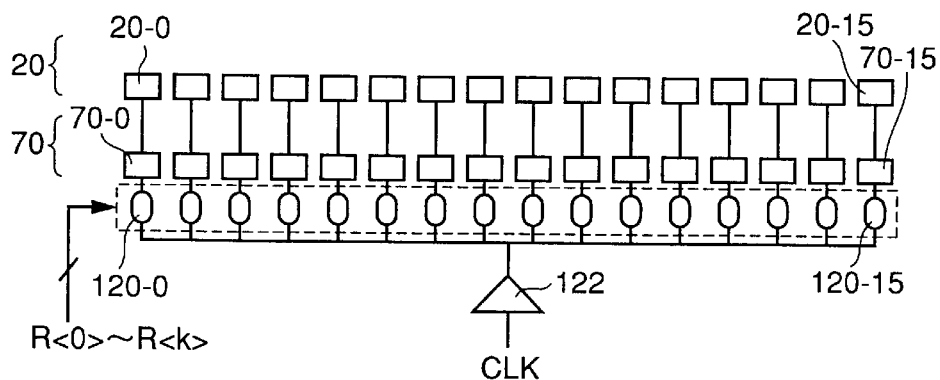
FIG. 10 is a conceptual diagram describing placement of skew correction circuits 120 according to a second embodiment of the present invention.

FIG. 10 is a conceptual diagram describing placement of skew adjustment circuits 120 according to the second embodiment. In FIG. 10, shown is a case where output data is of 16 bits and 16 data input/output terminals 20-0 to 20-15 are provided, as an example.

Referring to FIG. 10, data output buffer units 70-0 to 70-15 are provided correspondingly to respective data input/output terminals 20-0 to 20-15. The data output buffer units 70-0 to 70-15 receive a trigger clock CLK from a clock buffer 122 to output data to the data input/output terminals 20-0 to 20-15 at a timing in synchronism with the trigger clock CLK. Each of skew correction circuits 120-0 to 120-15 is connected between a corresponding one of the data input/output terminals 20-0 to 20-15 and a corresponding one of the data output buffer units 70-0 to 70-15.

Figure 11:
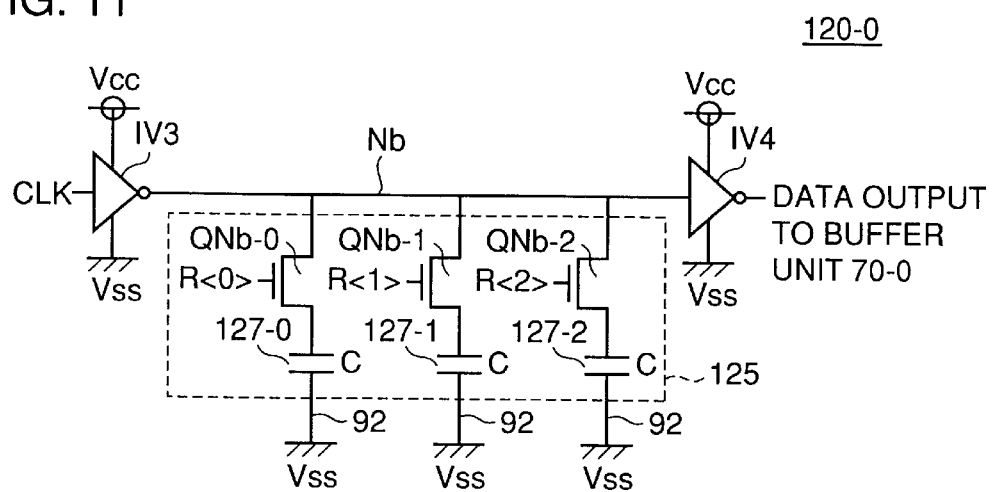
FIG. 11 is a circuit diagram representing an example of configuration of a skew correction circuit.

FIG. 11 is a circuit diagram representing a configuration of a skew correction circuit. Since the skew correction circuits 120-0 to 120-15 is similar to each other, in FIG. 11, typically shown is a configuration of the skew correction circuit 120-0.

Referring to FIG. 11, the skew correction circuit 120-0 includes an inverter IV3 transmitting a trigger clock CLK output by the clock buffer 122 to a node Nb, and inverter IV4 for transmitting a signal level of the node Nb to a corresponding data output buffer unit 70-0. A delay adjustment circuit 125 is connected between the node Nb and the ground node 92. The delay adjustment circuit 125 has a similar configuration as the input capacitance adjustment circuit 110 shown in FIG. 9.

The delay adjustment circuit 125 includes a pair of an N type MOS transistor QNb-0 and a capacitor 127-0, a pair of an N type MOS transistor QNb-1 and a capacitor 127-1 and a pair of an N type MOS transistor QNb-2 and a capacitor 127-2. Each N type MOS transistor and each capacitor are coupled in series between the node Nb and the ground node 92. The pairs of an N type MOS transistor and a capacitor are connected in parallel to one another.

While in FIG. 11, shown is a configuration of each skew correction circuit in which a propagation delay of the trigger clock CLK is adjusted in response to the internal parameter control signal set of 3 bits R<0> to R<2>, the number of bits of the internal parameter control signal can be arbitrarily set.

When in such a way, a trigger clock CLK is transmitted through the skew correction circuit 120-0 to 120-15 provided to respective data output buffers and a delay capacitance added in each skew correction circuit is set according to independent internal parameter control signals, then a skew between output data can be adjusted by parameter adjustment signals /BLW<0> to /BLW<k> which can be input from outside the package mold based on a result in actual measurement of an operation test and others.

Capacitance values of the capacitors 127-0 to 127-2 can be set not only to equal values similar to the practice in the first embodiment, but also to one of various values, changing step by step according to the number of bits of an internal parameter control signal used.

Figure 12:
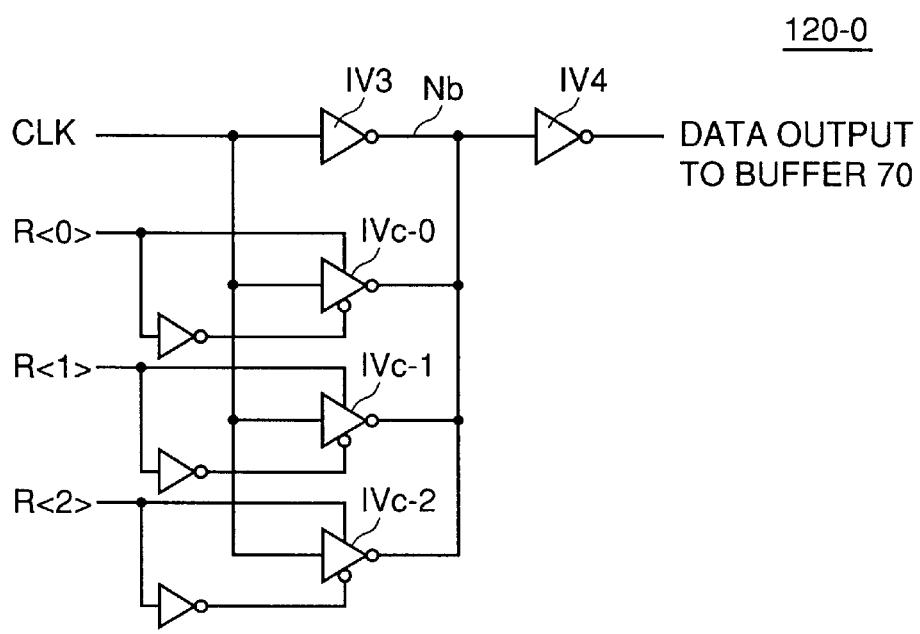
FIG. 12 is a circuit diagram representing another example configuration of the skew correction circuit.

FIG. 12 is a circuit diagram representing another example of configuration of the skew correction circuit. In FIG. 12 as well, typically shown is a configuration of the skew correction circuit 120-0.

Referring to FIG. 12, the skew correction circuit 120-0 includes the inverter IV3 transmitting a trigger clock CLK output by the clock buffer 122 to the node Nb, and inverters IVc-0, IVc-1 and IVc-2 connected in parallel to the inverter IV3. The inverters IVc-0, IVc-1 and IVc-2 are activated in response to internal parameter control signals R<0>, R<1> and R<2>, respectively. The skew correction circuit 120-0 further includes the inverter IV4 for transmitting a signal level of the node Nb to the corresponding data output buffer 70-0.

With such a configuration adopted, a transmission speed of a trigger clock CLK to the node Nb can be adjusted by controlling the number of inverters activated in response to the internal parameter control signals R<0> to R<2>. Note that the number of bits of the internal parameter control signal used in each skew correction circuit can be arbitrarily set according to the number of installed inverters connected in parallel to the inverter IV3.

When the skew correction circuits configured in this way are provided correspondingly to the respective data input/output terminals to transmit a trigger clock CLK and a transmission speed of the trigger dock in each skew correction circuit is set according to independent internal parameter control signals, then a skew between output data can be adjusted in a non-volatile manner by parameter adjustment signals /BLW<0> to /BLW<k> which can be input from outside the package mold based on a result in actual measurement in an operation test and others.

Note that while in FIG. 10, shown is a configuration in which skew correction circuits are provided correspondingly to respective data input/output terminals, a configuration can be adopted in which input capacitance adjustment circuits 110 for skew correction circuits can be provided only to some of the data input/output terminals according to reasons in designing or the like.

Modification of Second Embodiment

Figure 13:
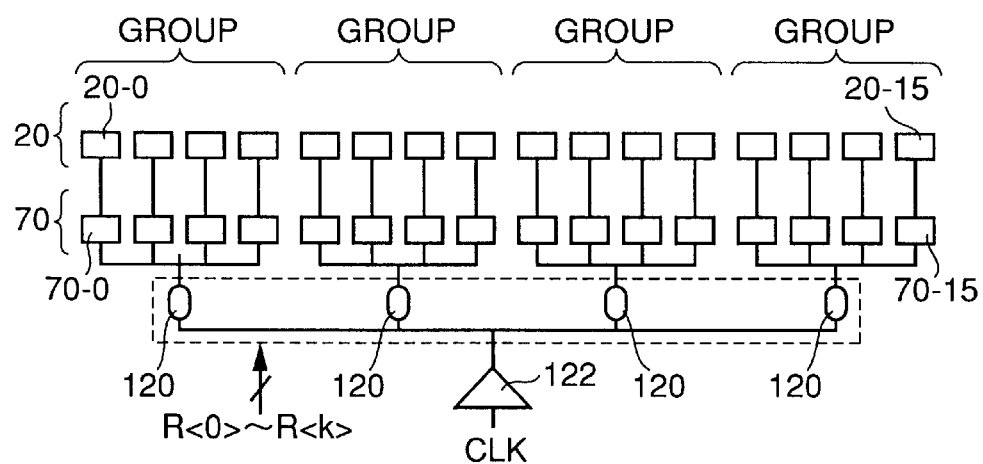
FIG. 13 is a conceptual diagram representing placement of skew correction circuits according to the second embodiment of the present invention.

Referring to FIG. 13, in the configuration of a skew correction circuit according to the second embodiment of the present invention, the data input/output terminals are divided into a plurality of groups. In FIG. 13, shown is a case where the 16 data input/output terminals are divided into four groups each including four terminals as an example.

In the modification of the second embodiment, skew correction circuits 120 are provided to the respective groups. With such a configuration adopted, a skew can be adjusted in a non-volatile manner by an input from outside the package mold in each group of data input/output terminals. As a configuration of the skew correction circuit, any of the configuration shown in FIGS. 9 and 11 can be applied. In such a way, by providing skew correction circuits to respective blocks, it can be prevented from occurring that the number of skew correction circuits increases excessively and thereby a layout area becomes insufficient.

Moreover, while in FIG. 13, shown is a case where the number of data input/output terminals included in each group is equal to others, division of the data input/output terminals is not limited to such a case, but a configuration may be adopted in which skew correction circuits 120 are provided to respective groups of data input/output terminals different in number.

Third Embodiment

In the third embodiment, description will be given of a configuration in which a refresh cycle is adjusted using internal parameter control signals.

Figure 14:
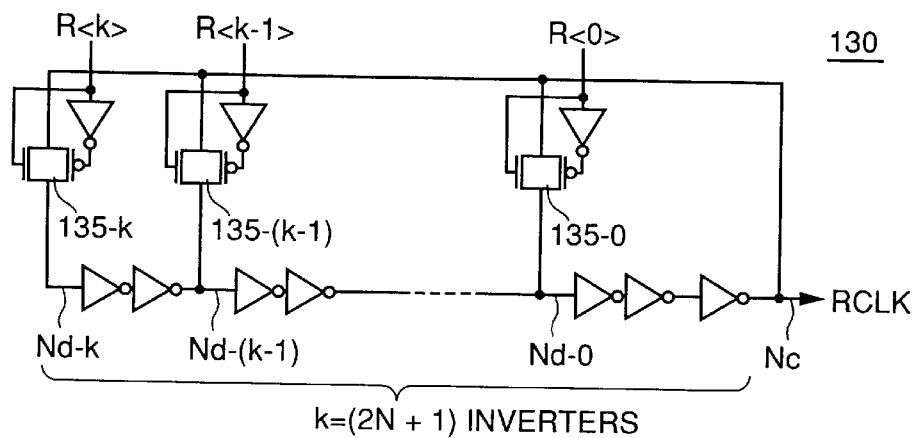
FIG. 14 is a circuit diagram representing a configuration of a refresh clock generating circuit 130 according to a third embodiment of the present invention.

FIG. 14 is a circuit diagram representing a configuration of a refresh clock generating circuit 130 according to the third embodiment.

The refresh clock generating circuit 130 is included in the control circuit 40 and generates a refresh clock RCLK which is an operation clock in a case where a refresh operation is instructed. In the refresh operation, count-up of a row address for refresh or the like by a refresh address generating circuit 36 is performed in synchronism with a refresh clock RCLK.

Referring to FIG. 14, the refresh clock generating circuit 130 includes inverters in number of (2n+1) (n is a natural number) connected in series to each other. An output node Nc at which a refresh dock RCLK is generated is coupled to an input node of an inverter in an upstream side through select switches 135-0 to 135-k. The select switches 135-0 to 135-k are on/off controlled in response to internal parameter control signals R<0> to R<k> and one of the switches is turned on.

With such configuration, inverter stages in number of (2m+1) (m is a natural number equal to or less than n) among a total of (2n+1) stages constitute a ring oscillator circuit circulating a refresh clock RCLK. A refresh clock RCLK is generated by the ring oscillator. An oscillation frequency f of the ring oscillator circuit is given by f=1/((2m+1).(th+tl)), wherein th and tl corresponds to a rise delay time and a fall delay time per one inverter, respectively.

Hence, by selective turning-on of one of the select switches 135-0 to 135-k corresponding to internal parameter control signals R<0> to R<k>, the number of inverter stages constituting a ring oscillator is adjusted and thereby, a frequency of a refresh clock RCLK can be adjusted.

Therefore, in an operation test after package molding, a data holding characteristic in a refresh operation is examined and thereafter, a refresh cycle is adjusted in a non-volatile manner by-the parameter adjustment signals /BLW<0> to /BLW<k>, which can be input from outside the package mold. After ensuring the data holding in such a way, low power consumption can be ensured.

Fourth Embodiment

In the fourth embodiment, description will be given of a configuration in which a word structure is set using internal parameter control signals.

Figure 15:
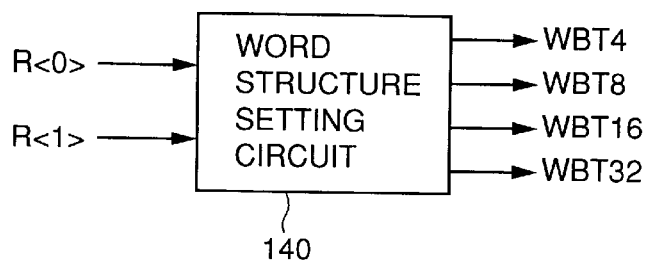
FIG. 15 is a circuit diagram representing a configuration of a word structure setting circuit 140 according to a fourth embodiment of the present invention.

FIG. 15 is a circuit diagram representing a configuration of a word structure setting circuit 140 according to the fourth embodiment. The word structure setting circuit 140 is included in the control circuit 40.

Referring to FIG. 15, the word structure setting circuit 140 activates one of word structure setting signals WBT4, WBT8, WBT16 and WBT32 according to 2 bits R<0> and R<1> of the internal parameter control signal set.

In response to activation of WBT4, WBT8, WBT16 and WBT32, word structures of the semiconductor memory device 1 are set to ×4 bits, ×8 bits, ×16 bits and ×32 bits, respectively. With adoption of a configuration in which setting of a word structure can be effected by inputting from outside the mold package, a word structure in a wafer level test performed in a chip state and a word structure on product shipment after package molding can be made different from each other.

For example, if a word structure is set to the maximum number of bits, that is ×32 bits which can be set as a word structure when R<0> =R <1> =L level, that is in a state where no anti-fuse element is blown, as a correspondence between a word structure and the internal parameter control signals R<0> and R<1>, then the process can be effectively performed in the operation test regardless of a word structure as a product specification, based on the maximum number of bits which can be set, e.g., ×32 bits, thereby enabling a shorter operation test time.

Figure 16:
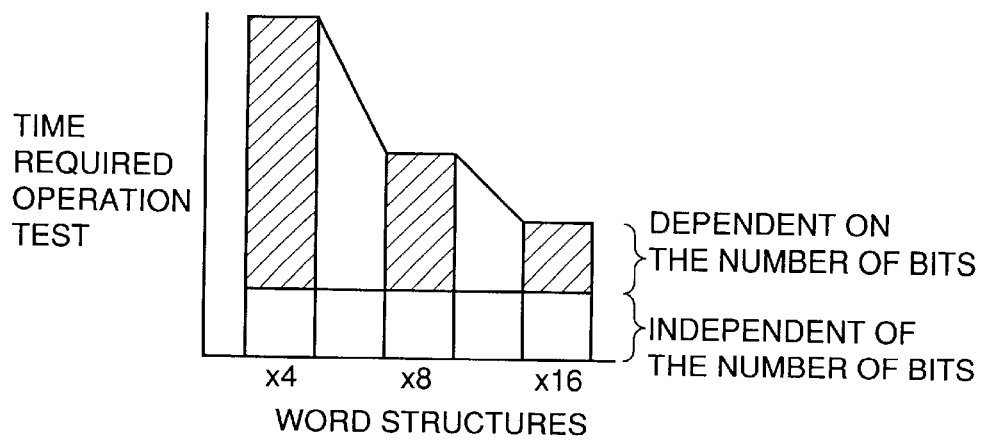
FIG. 16 is a conceptual diagram describing details of an operation test time.

FIG. 16 is a conceptual diagram describing details of an operation test time.

Referring to FIG. 16, an operation test time consists of an operation test requiring a prescribed time length independent of the number of bits of a word structure, and an operation test requiring a test time length dependent on the number of bits of a word structure. Hence, in the operation test whose time length depends on the number of bits of a word structure, a test time length can be shorter by effecting a multi-bit test. Therefore, when the number of bits of a word structure in an operation test is set larger than a specification value for product shipment according to the fourth embodiment, an operation time length can be shorter.

After an operation test is over, parameter adjustment signals are input according to a necessity from outside the package in order to meet a product specification to blow an anti-fuse element and thereby, a word structure in conformity with the product specification can be set in a nonvolatile manner.

Furthermore, by setting the number of bits of a word structure in a non-volatile manner after package molding, semiconductor memory devices can be matched with specifications in demand in the market or the like and shipped with flexibility in specifications.

Fifth Embodiment

In the fifth embodiment, description will be given of a configuration in which prior art adjustment of an internal parameter by fuse blowing or adjustment of an internal parameter using anti-fuse elements, each in the form of a memory cell, described in the first to fourth embodiments can be selectively performed.

Figure 17:
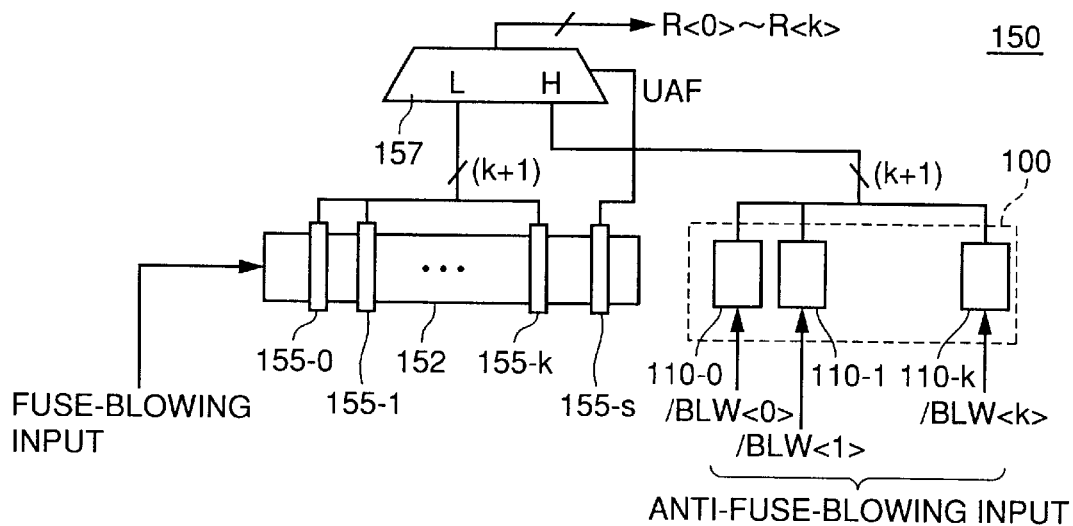
FIG. 17 is a circuit diagram representing a configuration of an internal parameter control circuit 150 according to a fifth embodiment of the present invention.

FIG. 17 is a circuit diagram representing a configuration of an internal parameter control circuit 150 according to the fifth embodiment. In the fifth embodiment, the configuration is such that in the configuration of the semiconductor memory device 1 shown in FIG. 1, an internal parameter control circuit 150 is substituted for the internal parameter control circuit 100. The other constituents of the configuration of the semiconductor memory device are similar to corresponding constituents thereof in the case of FIG. 1; therefore, any of descriptions thereof is not repeated.

Referring to FIG. 17, the internal parameter control circuit 150 further includes internal parameter control signal generating units 155-0 to 155-k each including a fuse element inside in addition to the configuration of the internal parameter control circuit 100 including the internal parameter control signal generating units 110-0 to 110-k each including a anti-fuse element. Configurations of the internal parameter control signal generating units 110-0 to 110-k are similar to that shown in FIG. 4.

The internal parameter control signal generating units 155-0 to 155-k generate internal parameter control signals R<0> to R<k> according to whether or not a fuse element included is blown. The fuse elements can be each blown by an input from outside.

Figure 18:
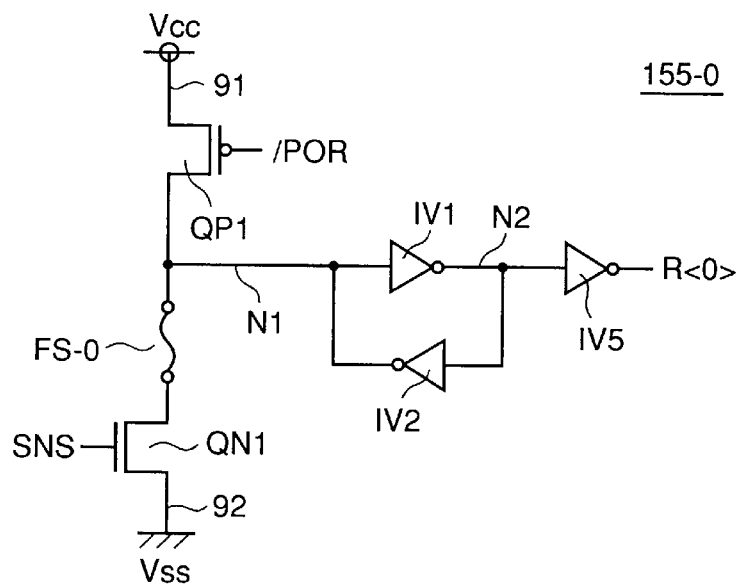
FIG. 18 is a circuit diagram representing a configuration of an internal parameter control signal generating unit provided correspondingly to a fuse element.
Figure 19:
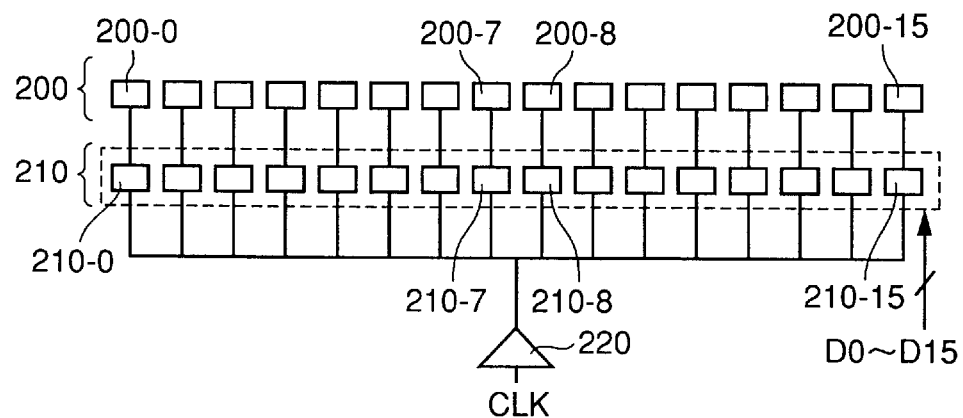
FIG. 19 is a conceptual diagram representing a configuration performing data output in synchronism with a trigger clock.
Figure 20A:
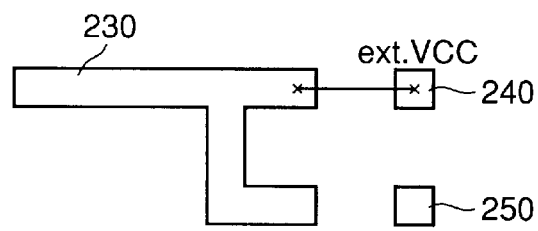
FIGS. 20A and 20B are conceptual diagrams describing a conventional setting method for a word structure.
Figure 20B:
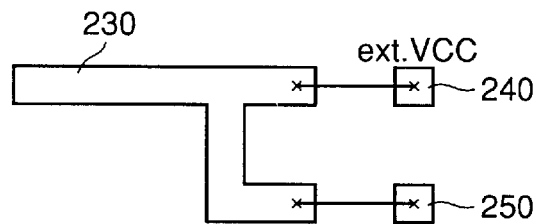
Figure 21:
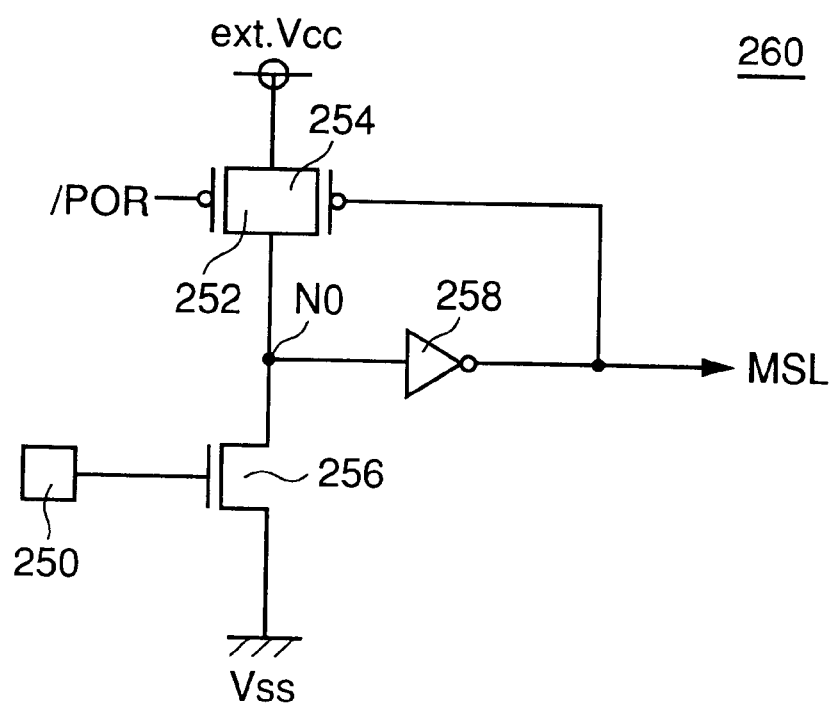
FIG. 21 is a circuit diagram representing a configuration of a mode select circuit generating a mode select signal according to a coupling state of a mode select terminal.

FIG. 18 is a circuit diagram representing a configuration of an internal parameter control signal generating unit including a fuse element. Constructions of internal parameter control signal generating units provided in a corresponding manner to respective fuse elements are similar to each other; therefore, in FIG. 18, typically shown is a configuration of the internal parameter control signal generating unit 155-0.

Referring to FIG. 18, the internal parameter control signal generating unit 155-0 is different compared with the internal parameter control signal generating unit 110-0 shown in FIG. 4 in that a fuse element FS-0 is substituted for the anti-fuse element 120-0 and the unit 155-0 further includes an inverter IV5 for generating an internal parameter control signal R<0> by further inverting a signal level of the node N2. Furthermore, when a fuse element is blown by laser beam, the transistor QP2 for applying the high power source potential is not necessary. The other constituents of the configuration are similar to corresponding constituents of the internal parameter control signal generating unit 110-0; therefore, any of detailed descriptions thereof is repeated.

With such a configuration adopted, the internal parameter control signal generating unit 155-0 can set a signal level of an internal parameter control signal R<0> in a non-volatile manner according to whether or not a fuse blowing corresponding to the fuse element FS-0 is effected. That is, when the fuse element FS-0 has not been blown, the internal parameter control signal R<0> can be set to L level, while when the fuse element FS-0 has been blown, a signal level of the internal parameter control signal R<0> can be set to H level.

With such a configuration adopted, the internal parameter control signals corresponding to a fuse element and an anti-fuse element can be set at same signal level according to the same state of presence/absence of a blowing input in each internal parameter control signal generating unit.

Referring again to FIG. 17, the internal parameter control circuit 150 further includes a select signal generating circuit 155-s for selecting whether or not an anti-fuse element is used according to the presence or absence of fuse blowing. A configuration of the select signal generating circuit 155-s is similar to the configuration of the internal parameter control signal generating unit 150-0 and a signal level of a select signal UAF is set according to the presence or absence of the blowing of a corresponding fuse element.

The internal parameter control circuit 150 further includes a selector 157 selectively outputting internal parameter control signals R<0> to R<k> generated by one of a set of internal parameter control signal generating units 155-0 to 155-k corresponding to fuse elements and a set of internal parameter control signal generating units 110-0 to 110-k corresponding to anti-fuse elements, according to a select signal UAF. Adjustment of internal parameters of the semiconductor memory device 1 based on each of configurations shown in the first and fourth embodiments is performed according to the internal parameter control signals R<0> to R<k> output by the selector 157.

In the internal parameter control circuit 150, when adjustment of an internal parameter using an anti-fuse element is desired to be performed after package molding, a fuse element corresponding to the select signal generating circuit 155-s is blown. By doing so, a signal level of the select signal UAF is set to H level and the selector 157 outputs internal parameter control signals R<0> to R<k> generated by the internal parameter control signal generating units 110-0 to 110-k.

On the other hand, when a fuse element corresponding to the select signal generating circuit 155-s has not been blown, the selector 157 outputs parameter adjustment signals R<0> to R<k> generated by the internal parameter control signal generating units 155-0 to 155-k. In this case, adjustment of an internal parameter of the semiconductor memory device 1 is performed according to the presence or absence of a bowing input to each fuse element in a laser trimming step prior to the package molding.

Generally speaking, in an initial stage of mas production of semiconductor memory devices, there is a tendency that a variation occurs in resistance value Rmc after breakdown of an insulating film of a memory cell used as an anti-fuse element. Therefore, there is a fear that in this state, a desired internal parameter adjustment instruction cannot be programmed even when an anti-fuse element is blown. Therefore, adjustment of an internal parameter only by an anti-fuse element constituted of a memory cell in the initial stage of mas production is accompanied with risks.

Accordingly, when a conventional configuration in which an internal parameter control signal can be set according to fuse blowing coexists in parallel to a configuration in which an internal parameter control signal can be set by an anti-fuse element in a semiconductor memory device and a composite configuration is achieved such that both configurations can be selectively used, then adjustment means of both kinds can be switched over in the same chip corresponding to fluctuations in process conditions for fabrication of semiconductor memory devices without revising a mask used in the fabrication to adjust an internal parameter with certainty.

Note that while in the first to fourth embodiments, an input capacitance, a skew of an output signal, a cycle of a refresh timer and a word structure are shown as internal parameters which are objects to be adjusted, the internal parameters are only examples. That is, adjustments of various internal parameters can be performed using internal parameter control signal generating units in which a memory cell is used as an anti-fuse element, according to the constitution of the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells including a capacitor for holding data;
   a plurality of parameter adjustment terminals capable of being input with signals from outside after package molding;
   an internal parameter control circuit for adjusting internal parameters of said semiconductor memory device from outside,
   said internal parameter control circuit including
      a plurality of control signal generating units respectively provided corresponding to said plurality of parameter adjustment terminals and generating a plurality of internal parameter control signals, respectively,
      each said control signal generating unit having
      a program element responding to a signal input corresponding to one of said plurality of parameter adjustment terminals to make a non-volatile transition from a first state to a second state,
      said program element having
      a capacitor included in one of said plurality of memory cells, and
      each said control signal generating unit setting a signal level of a signal of a corresponding one of said plurality of internal parameter control signals according to a state of the program element in response to turning-on of a power source for said semiconductor memory device, and holding said signal level during turning-on of said power source; and
   an internal circuit operating based on said internal parameters being set according to said signal levels of said plurality of internal parameter control signals.

2. The semiconductor memory device according to claim 1, wherein
   said plurality of parameter adjustment terminals are shared for inputting a plurality of external input signals for instructing operation of said semiconductor memory device and for inputting said signals from outside after package molding,
   said semiconductor memory device has first and second signal input modes, which are switched over according to signal levels of a plurality of signals input to said plurality of parameter adjustment terminals, said plurality of parameter adjustment terminals receives inputs of said plurality of external input signals in said first signal input mode, and each of said plurality of internal parameter control signals makes said non-volatile transition of the program element in response to a signal input to a terminal of said corresponding plurality of parameter adjustment terminals in said second signal input mode.

3. The semiconductor memory device according to claim 1, further comprising:

a plurality of signal input terminals for receiving a plurality of external input signals, wherein said internal circuit includes:
a plurality of signal input buffers provided corresponding to said respective plurality of signal input terminals, respectively and each generating an internal signal according to a signal level of a signal of a corresponding one of said plurality of external input signals, wherein each of said plurality of signal input buffers includes:
a signal transmission node transmitting the corresponding one of said plurality of external input signals;
a delay adjustment circuit adding a delay capacitance corresponding to a signal level of at least one of said plurality of internal parameter control signals to said signal transmission node; and
a differential amplifier circuit setting a signal level of said internal signal according to a correlation between a potential level of said signal transmission node and a reference potential.

4. The semiconductor memory device according to claim 1, further comprising:

a plurality of data output terminals for outputting a plurality of data to outside, wherein said internal circuit includes:
a clock buffer driving a trigger clock;
a plurality of data output buffers provided corresponding to said plurality of data output terminals, respectively, and outputting said plurality of data to a corresponding one of said plurality of data output terminals in response to said trigger clock; and
at least one delay adjustment circuit provided between said clock buffer and said plurality of data output buffers, wherein said delay adjustment circuit includes:
a signal transmission node transmitting said trigger clock; and
a delay adjustment unit adding a delay capacitance corresponding a signal level of at least one of said plurality of internal parameter control signals to said signal transmission node.

5. The semiconductor memory device according to claim 4, wherein said delay adjustment circuit is connected between at least one of said plurality of data output buffers and said clock buffer.

6. The semiconductor memory device according to claim 4, wherein said plurality of data output terminals are divided into a plurality of groups, and
said delay adjustment circuit is provided corresponding to each of at least one of said plurality of groups and connected between the data output buffers corresponding to said each of at least one of the groups and said clock buffer.

7. The semiconductor memory device according to claim 1, further comprising:

a plurality of data output terminals for outputting a plurality of data to outside, wherein said internal circuit includes:
a clock buffer driving a trigger clock;
a plurality of data output buffers provided corresponding to said plurality of data output terminals, respectively, and outputting said plurality of data to a corresponding one of said plurality of data output terminals in response to said trigger clock; and
at least one delay adjustment circuit provided between said clock buffer and said plurality of data output buffers, wherein said delay adjustment circuit includes
a plurality of signal transmission elements arranged in parallel for transmitting said trigger clock, and
said delay adjustment circuit transmits said trigger clock by activation of said signal transmission elements in number corresponding to a signal level of at least one of said plurality of internal parameter control signals among said plurality of signal transmission elements.

8. The semiconductor memory device according to claim 7, wherein said delay adjustment circuit is connected between at least one of said plurality of data output buffers and said clock buffer.

9. The semiconductor memory device according to claim 7, wherein said plurality of data output terminals are divided into a plurality of groups, and
said delay adjustment circuit is provided correspondingly to each of at least one of said plurality of groups and connected between a data output buffer corresponding to said each of at least one of the groups and said clock buffer.

10. The semiconductor memory device according to claim 1, wherein said internal circuit includes:
a refresh clock generating circuit generating a refresh clock repeating first and second signal levels at a constant cycle for performing a refresh operation, and
said refresh clock generating circuit sets said constant cycle according to a signal level of at least one of said plurality of internal parameter control signals.

11. The semiconductor memory device according to claim 10, wherein said refresh clock generating circuit includes
a plurality of inverters in number of L (L is an odd natural number) connected in series from an upstream side to a down-stream side, and
an output node generating said refresh clock, and
said refresh clock generating circuit circulates said refresh clock using M (M is an odd natural number equal to or less than L) of L said inverters located in said upstream side from said output node and
said refresh clock generating circuit sets M according to a signal level of at least one of said plurality of internal parameter control signals.

12. The semiconductor memory device according to claim 1, wherein said internal circuit includes:
a word structure setting circuit setting the number of bits in a word structure that is the number of bits of data, which can be input/output, in response to one time access from said semiconductor memory device, according to a signal level of at least one of said plurality of internal parameter control signals.

13. The semiconductor memory device according to claim 12,
wherein the number of bits in a word structure of said semiconductor memory device is set in an operation test to a specification value or higher for product shipment.

14. The semiconductor memory device according to claim 1,
wherein said program element enters a broken-down state of a dielectric film of said capacitor in said second state to act as a resistance element.

15. The semiconductor memory device according to claim 1,
wherein said internal parameter adjustment circuit further includes:
  a plurality of control signal generating sub-units generating said plurality of internal parameter control signals respectively;
  a parameter adjustment switching unit generating an adjustment select signal; and
  a selector circuit outputting said plurality of internal parameter control signals generated by one of said plurality of control signal generating units and said plurality of control signal generating sub-units to said internal circuit according to said adjustment select signal,
wherein each of said plurality of control signal generating sub-units and said parameter adjustment switching unit has a fuse element which can be blown by an external input, and
each of said plurality of control signal generating sub-units and said parameter adjustment switching unit sets a signal level of a corresponding one of said plurality of internal parameter control signals and said adjustment select signal according to the presence/absence of the blowing of said fuse element in response to turning-on of a power source for said semiconductor memory device, and holds said signal level during turning-on of said power source.

* * * * *

UNITED STATES PATENT AND TRADEMARK OFFICE
CERTIFICATE OF CORRECTION

PATENT NO.     : 6,424,593 B1
DATED          : July 23, 2002
INVENTOR(S)    : Shigehiro Kuge et al.

It is certified that error appears in the above-identified patent and that said Letters Patent is hereby corrected as shown below:

<u>Title page,</u>
Item [73], Assignee, change "Mitsubishi Denki Kaubushiki Kaisha, Tokyo (JP)" to
-- Mitsubishi Denki Kabushiki Kaisha, Tokyo (JP) --

Signed and Sealed this

Eighteenth Day of March, 2003

JAMES E. ROGAN
*Director of the United States Patent and Trademark Office*